(12) United States Patent
Knapp et al.

(10) Patent No.: US 6,835,580 B1
(45) Date of Patent: Dec. 28, 2004

(54) DIRECT CHIP ATTACH STRUCTURE AND METHOD

(75) Inventors: James Knapp, Gilbert, AZ (US); Kok Yang Lau, Asahan Melaka (MY); Beng Lian Lim, Negeri Sembilan (MY); Guan Keng Quah, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/603,258

(22) Filed: Jun. 26, 2003

(51) Int. Cl.[7] .......................... H01L 21/66; G01R 31/26
(52) U.S. Cl. ........................ 438/15; 438/111; 438/112
(58) Field of Search ..................... 438/15, 111, 112, 438/123, 124, 127, 612, 613, 614

(56) References Cited

U.S. PATENT DOCUMENTS 6,372,622 B1 * 4/2002 Tan et al. .................. 438/612

* cited by examiner

*Primary Examiner*—Hoai Pham
(74) *Attorney, Agent, or Firm*—Kevin B. Jackson

(57) ABSTRACT

A method for forming a direct chip attach (DCA) device (1) includes attaching a chip (3) to a lead frame (2). Conductive studs (22) are attached to bonding pads (13) on the chip (3) and a flag (18) on lead frame (2). The chip (3) and flag (18) are enclosed with an encapsulating layer (4), and openings (6) are formed in an upper surface (7) to expose conductive studs (22). In one embodiment, a masking layer (51) is applied to the lead frame (2), and the structure is then placed in an electroless plating apparatus (61). While in the plating apparatus (61), an injection device (66) injects plating solution (71) towards the upper surface (7) and openings (6) to enhance the formation of barrier layers (24) on the conductive studs (22). Solder bumps (9) are then attached to barrier layers (24) through the openings (6).

20 Claims, 4 Drawing Sheets

DIRECT CHIP ATTACH STRUCTURE AND METHOD

BACKGROUND OF THE INVENTION

This invention relates, in general, to electronic device packaging, and more specifically to a structure and method for forming reliable interconnects in flip-chip type electronic packages.

Semiconductor chips usually are encapsulated in a device package prior to installation into an electronic system. Device or chip packages perform several key functions including, a) interconnective leads that allow the chip to be connected to the electronic system; b) physical protection; c) environmental protection; and d) heat dissipation. These functions present chipmakers with a number of design and manufacturing challenges that must be balanced with other factors such as cost.

Flip-chip packaging is one type of electronic chip packaging technology, and has been in existence for more than 30 years. Flip-chip packaging has progressed to include a wide variety of materials and methods for bumping, attaching and underfilling devices. Although the technology has progressed, challenges still exist in solving problems with higher frequency applications, tighter space requirements, reduced costs, and general device performance.

Current flip-chip package designs for semiconductor components include direct chip attach (DCA) structures. DCA refers to the direct attachment of an electronic chip to a circuit such as a printed circuit board (PCB) or a flex circuit. In typical DCA structures, metal studs such as gold studs are attached to the chip, and the structure is then encapsulated with a passivation material or mold compound. Next, openings are formed in the mold compound to expose the metal studs, and solder balls or bumps are then attached through the openings to provide contacts to the encapsulated chip. The solder bumps on the DCA device are then attached to the printed circuit board, flex circuit, or next level of assembly.

One problem with current DCA structures occurs at the solder ball/metal stud interface. For example, when the solder ball comprises a lead/tin alloy and the metal stud comprises gold, the gold tends to dissolve into the solder ball over time. This creates a gap between the gold stud and the solder ball, which leads to poor contact and weak joints. The poor contact and weak joints results in device reliability and performance problems.

Accordingly, a need exists for more reliable DCA structures. Additionally, a need exists for a cost effective and reproducible method of forming a more reliable DCA structure.

DETAILED DESCRIPTION OF THE DRAWINGS

In general, the present invention provides a direct chip attach (DCA) structure that includes a barrier layer formed between a conductive stud and a solder bump. In a preferred embodiment, the barrier layer comprises nickel.

In addition, the present invention provides a method for forming a DCA structure having a barrier layer. In particular, an electronic chip is attached to a lead frame structure and a conductive stud is attached to a bond pad on a surface of the chip. The lead frame substrate and electronic chip are then encapsulated in, for example, a mold cavity. Next, openings are formed in the encapsulating material to expose the conductive stud. A barrier layer is then deposited on the conductive stud. Next, a solder ball is attached to the barrier layer.

In a preferred embodiment, an electroless nickel barrier layer is formed by immersing the structure in an electroless nickel plating bath, forcing a stream of plating solution onto the surface of the structure to enhance deposition of the barrier layer. Alternatively or additionally, agitation is used to enhance deposition in the electroless plating bath.

The present invention is better understood by referring to FIGS. 1–6 together with the following detailed description. For ease of understanding, like elements or regions are labeled the same throughout the detailed description and FIGURES.

Figure 1:
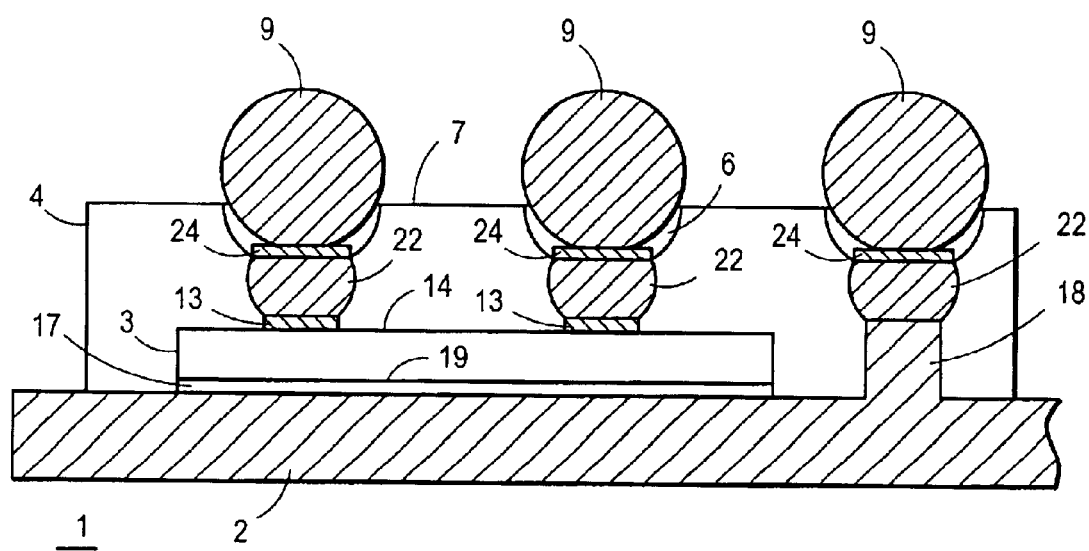
FIG. 1 illustrates, an enlarged cross-sectional view of a direct chip attach device according to the present invention.

FIG. 1 shows an enlarged cross-sectional view of a direct chip attach (DCA) device 1 according to the present invention. DCA device 1 includes a lead frame or support substrate 2 and an electronic chip, device or component 3. Chip 3 includes bond pads or contacts 13 on an upper or outer surface 14. Chip 3 is attached to lead frame 2 with a die attach layer 17.

Lead frame 2 further includes a flag 18, which provides an upper or topside contact to lower surface 19 of chip 3. When chip 3 comprises a power MOSFET device for example, contacts 13 form source contacts, and flag 18 forms a topside drain or drain contact.

DCA device 1 also includes conductive bumps, balls, or studs 22, which are attached to contacts 13. In a preferred embodiment, a conductive stud 22 is also attached to flag 18.

According to the present invention, a barrier layer 24 is formed on an upper, bonding, or exposed surface of studs 22. Barrier layer 24 comprises a material that is, metallurgically compatible with studs 22 and solder bumps 9, and that prevents the elements or components of studs 22 and solder balls 9 from diffusing, inter-mixing or dissolving into each other. For example, when studs 22 comprise gold and solder balls 9 comprise a lead/tin alloy, barrier layer 24 preferably comprises a nickel layer. Preferably, barrier layer 41 is approximately 2 microns to approximately 7 microns thick. By preventing the elements of conductive studs 22 and solder balls 9 from inter-mixing and forming gaps or voids in the interconnect structure, barrier layer 24 provides a DCA device that has a more reliable interconnect structure.

DCA device 1 further includes an encapsulant or protective, layer 4 covering chip 3 and flag 18. Protective layer 4 has openings 6 formed in an upper or major surface 7. Solder or conductive balls, spheres, or bumps 9 are coupled to chip 3 and lead frame 2 through or in openings 6.

Figure 2:
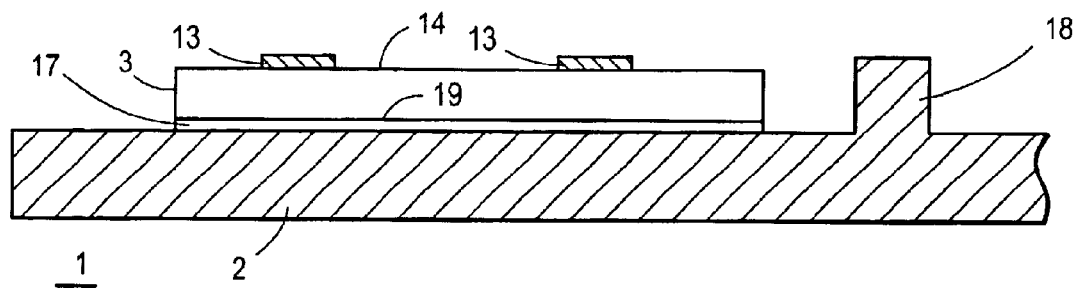
FIGS. 2–5 illustrate, enlarged cross-sectional views of the direct chip attach device of FIG. 1 at various stages of fabrication.

Turning now to FIGS. 2–5, a preferred method for forming DCA device 1 is described. FIG. 2 illustrates an enlarged cross-sectional view of DCA device 1 at an early stage of fabrication. In this step, chip 3 is attached to lead frame 2 using conventional die attach processes such as eutectic die attach, conductive epoxies or soft solder processes to form a die attach layer 17. For example, chip 3 is attached using a lead/tin (Pb/Sn) soft solder process.

By way of example, chip 3 comprises a power MOSFET, logic, sensor device, passive device, or bipolar device. Chip 3 includes bond pads or contacts 13 on an upper surface 14. Bond pads 13 comprise, for example, aluminum/aluminum-silicon/aluminum-silicon-copper multi-layer structure. Lead frame 2 including flag 18 preferably comprises copper, a copper alloy (e.g., TOMAC 4, TAMAC 5, 2ZFROFC, or CDA194), a copper plated iron/nickel alloy (e.g., copper plated Alloy 42), or the like.

Figure 3:
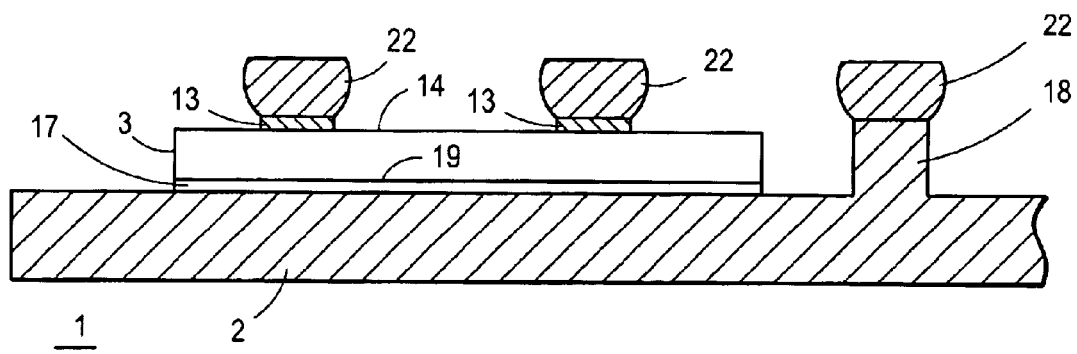

Next, as shown in FIG. 3, conductive studs 22 are attached to bond pads 13. In a preferred embodiment, a conductive stud 22 is also attached to flag 18. In an alternative embodiment, the height of flag 18 is designed to match the height of conductive studs 22 and bond pads 13, and a stud 22 is not placed on flag 18.

Conductive studs 22 are attached using, for example, ultrasonic, thermocompression, or thermosonic bonding techniques. Conductive studs 22 comprise, for example, gold or copper. In one embodiment, conductive studs 22 are formed with wire bond balls using conventional wiring bonding techniques. Preferably, any remaining portion of wire above the wire bond ball is removed, which leaves only conductive studs 22 on bond pads 13 and flag 18 as shown in FIG. 3.

Alternatively, conductive studs 22 are formed using solder balls that are reflowed for electrical and mechanical attachment to bond pads 13 and flag 18. In a further embodiment, conductive studs 22 are formed using conductive epoxies. Preferably, conductive studs 22 have a height from about 75 microns to about 1,500 microns.

Figure 4:
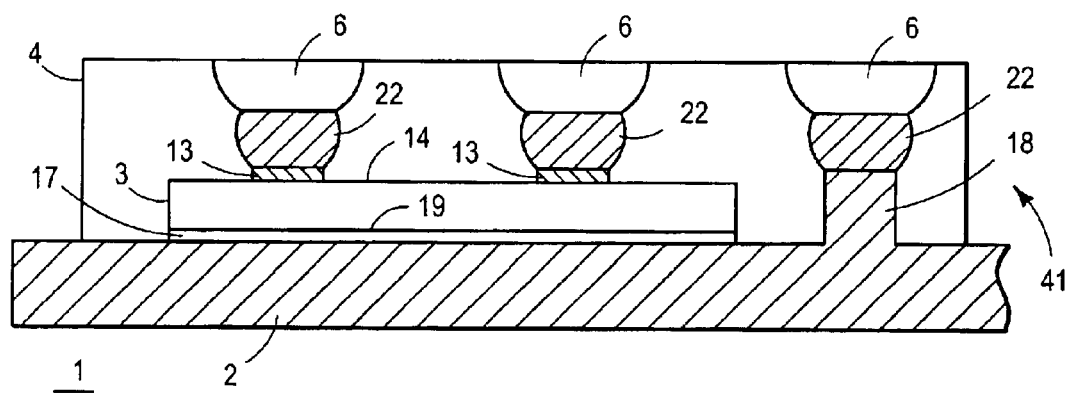

FIG. 4 shows an enlarged cross-sectional view of DCA device 1 after an encapsulation step to form protective layer 4, and after the formation of openings 6. Preferably, chip 3 and lead frame 2 are encapsulated using conventional transfer molding techniques. Protective layer 4 comprises, for example, an epoxy novolac-based resin. After the molding process, encapsulant 4 is post-cured, and openings 6 are then formed using chemical etching or laser burning techniques to expose upper surfaces of conductive studs 22. Alternatively, openings 6 are formed in-situ during the molding process using pins that contact studs 22 to prevent molding compound from covering the upper surfaces of studs 22. At this stage of fabrication, a sub-assembly 41 is formed.

Figure 5:
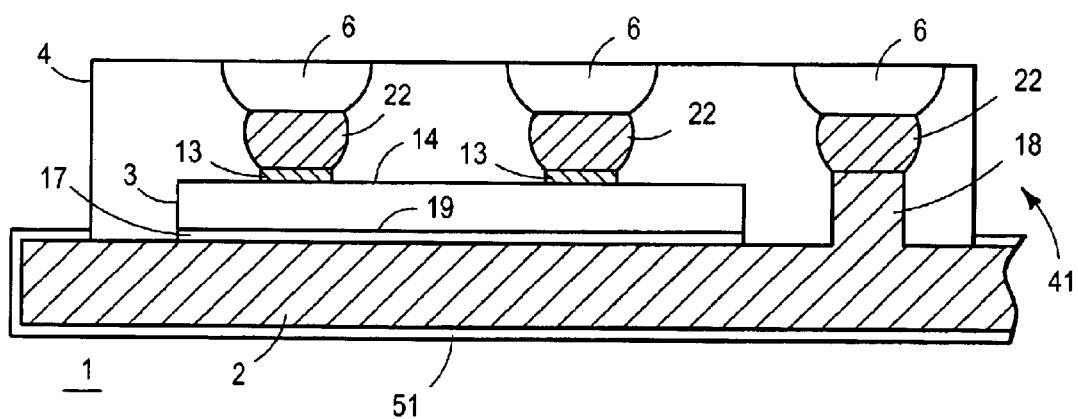

FIG. 5 shows an enlarged cross-sectional view of DCA device 1 or sub-assembly 41 at a next step of fabrication where a masking layer 51 is formed over lead frame 2. When barrier layer 24 is deposited using electroless plating techniques, masking layer 51 prevents conductive material from depositing on lead frame 2. That is, masking layer 51 provides a more efficient process whereby conductive material preferentially deposits on studs 22 in openings 6 and not on lead frame 2.

In particular, the authors found that when conductive studs 22 comprise gold and lead frame 2 comprises copper, masking layer 51 is preferred with commercially available electroless nickel plating solutions, such as NiPlate BP10000M, BP10000S, or BP R(available from Shipley-Ronan) in order to achieve more optimum nickel deposition rates on gold conductive studs. Masking layer 51 preferably comprises an adhesive lead frame tape, a polyester film such as Mylar®, or other adhesive polymer films.

Additionally, because openings 6 in some DCA devices have very small diameter, on the order of 0.2 to 0.5 millimeters (mm) wide, the authors further found that conventional electroless plating techniques were insufficient for forming barrier layer 24. Specifically, conventional techniques, where devices are simply immersed an electroless bath, are inadequate because deposition rates are far too slow and inconsistent.

Additionally, depositing barrier materials on conductive studs 22 is challenging due to an electric double layer that forms when DCA device 1 is placed in a electroless plating solution. An electric double layer occurs at the interface between an electrode (e.g., conductive stud 22) and an electrolyte solution that is created by charge—charge interaction (i.e., charge separation). This leads to an alignment of oppositely charged ions at the surface of the electrode. The electric double layer has a thickness that can impede or slow the deposition process.

Figure 6:
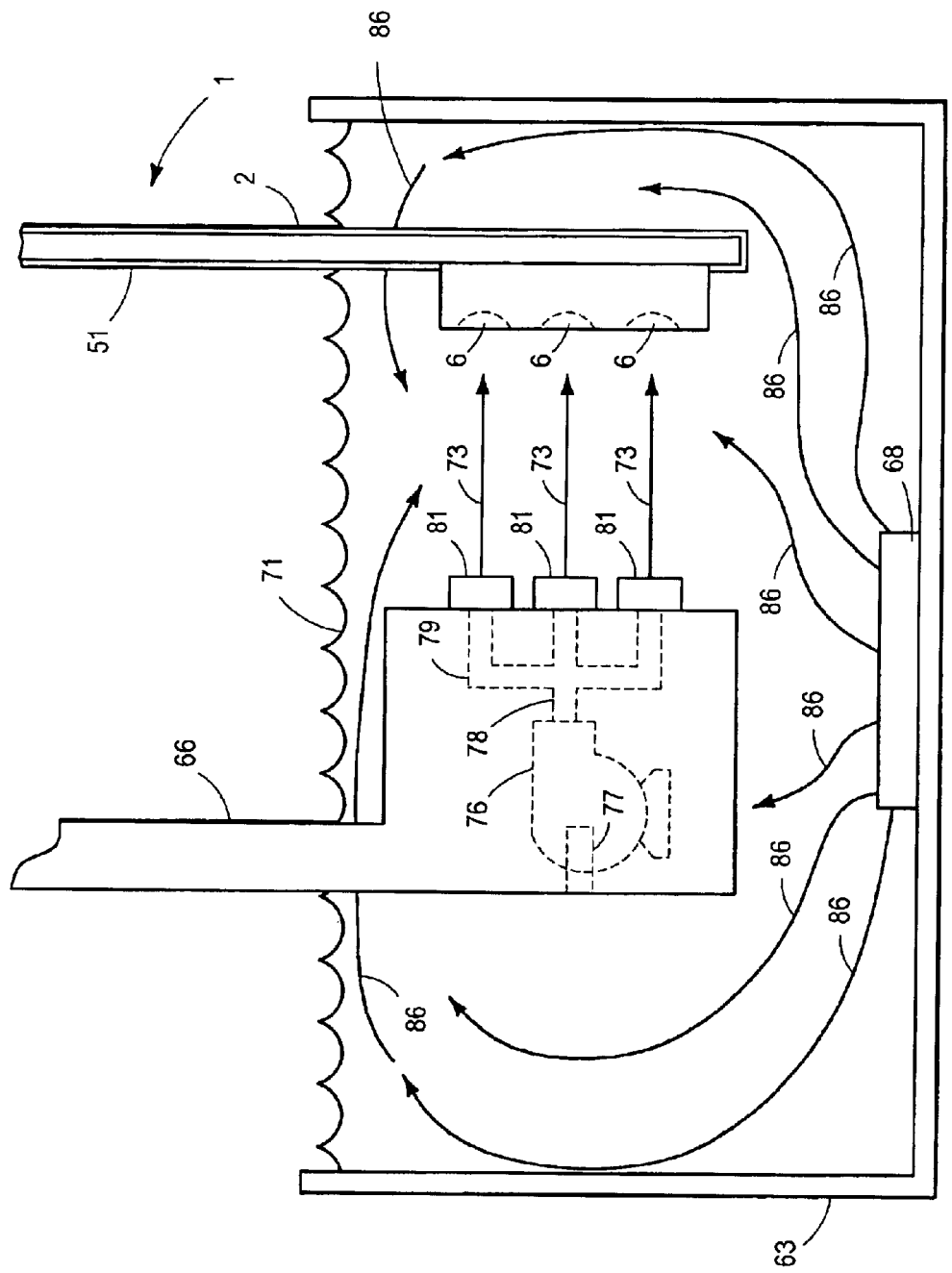
FIG. 6 illustrates, a side-view of an apparatus according to the present invention for forming the direct chip attach device of FIG. 1.

Accordingly, FIG. 6 illustrates a side view of a preferred plating apparatus 61 according to the present invention for overcoming the challenges set forth above. Plating apparatus 61 includes a bath 63 containing a plating solution 71, a jetting, pumping or injecting device 66, and an agitating or mixing device 68. While DCA device 1 is placed in bath 63, plating solution 71 is injected or forced towards openings 6 through injecting device 66 as illustrated by flow lines 73.

Injecting device 66 comprises, for example, a pump 76 having an inlet 77 and an outlet 78 (shown in phantom), a manifold 79 (shown in phantom), and nozzles 81. Nozzles 81 are placed to direct plating solution 71 towards or directly to openings 6 of DCA device 1. Preferably, nozzles 81 each have an orifice or opening with a diameter of approximately 1 to 3 mm to provide a solid stream of plating solution. Although 3 nozzles 81 are shown, more or less can be used depending on the characteristics of the device (e.g., geometries, materials, sizes, etc.) being plated. Additionally, pump 76 may be external to bath 63 with inlet 77 and outlet 78 extended to couple pump 76 to bath 63 and manifold 79.

By forcing plating solution 71 towards openings 6, injecting device 61 helps overcome the impact of the small dimensions of openings 6 on the formation of barrier layer 24. Also, injecting device 61 functions to reduce the thickness of the electric double layer, and thereby increase the concentration gradient of the material being deposited (e.g., nickel) on conductive studs 22 in the region near conductive studs 22 (i.e., the interface layer between plating solution 71 and conductive studs 22). This in turn enhances barrier layer 24 growth rates.

As shown in FIG. 6, plating device 61 alternatively or further includes an agitating device 68. Agitating device comprises, for example, a mechanical stirring device, a magnetic stirring device, or the like. Agitating device 68 functions to agitate plating solution 71 as indicated by flow lines 76, and further enhances the deposition rate during the formation of barrier layer 24.

To provide uniform barrier layers 24, plating solution 71 (e.g., NiPlate BP10000M, BP10000S, or BP R available from Shipley-Ronan) is maintained for example, at a process temperature of approximately 85 to 95 degrees Celsius during plating. Also, injection device 66 preferably provides a flow rate of plating solution 71 of approximately 19 to 38 liters/min. Additionally, agitation device 68 rotates at approximately 80 to 100 rotations per minute (rpm). The above parameters, consumables, and conditions produce, for example, a nickel growth rate of approximately 0.25 microns per minute.

Although an electroless plating process has been described, electrolytic plating techniques may be used to form barrier layer 24 when chip 3 comprises a device that can pass or conduct current during the plating process. For example, electrolytic plating techniques can be used when chip 3 comprises a diode device that passes current in a forward bias mode during plating.

Thus it is apparent that there has been provided, in accordance with the present invention, an improved DCA device structure having a barrier layer formed between a conductive stud and a solder bump. The barrier layer prevents elements of the conductive stud and solder bump from inter-mixing thereby avoiding the formation of voids and gaps. This improves interconnect integrity and device performance and reliability. Additionally, a method and apparatus for forming the barrier layer has been described that is cost effective and reproducible, and overcomes the shortcomings of conventional electroless plating techniques.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for forming an electronic package comprising the steps of;
    attaching an electronic chip to a support substrate, wherein the electronic chip includes a bond pad on an outer surface;
    attaching a conductive stud to the bond pad;
    encapsulating the electronic chip to form a sub-assembly having an upper surface;
    forming an opening in the upper surface to expose the conductive stud;
    forming a barrier layer on the conductive stud; and
    attaching a solder bump to the barrier layer.

2. The method of claim 1 wherein the step of forming the barrier layer includes forming a nickel barrier layer.

3. The method of claim 1 wherein the step of forming the barrier layer comprises the steps of:
    placing the sub-assembly in an electroless plating bath; and
    injecting plating solution towards the opening to form the barrier layer on the conductive stud.

4. The method of claim 3 further comprising the step of agitating the electroless plating bath.

5. The method of claim 3 wherein the step of placing the sub-assembly includes placing the sub-assembly in an electroless nickel plating solution.

6. The method of claim 3 further comprising the step of masking the support substrate.

7. The method of claim 1 wherein the step of attaching the conductive stud includes attaching a gold stud.

8. A method for forming a direct chip attach device comprising the steps of:
    providing a sub-assembly comprising a lead frame, a chip attached the lead frame, a bond pad formed on an outer surface of the chip, a conductive bump attached to the bond pad, and an encapsulating layer covering the chip, wherein the encapsulating layer has an opening to expose the conductive bump;
    placing the sub-assembly in an electroless plating solution; and
    injecting electroless plating solution towards the opening to form a barrier layer on the conductive bump.

9. The method of claim 8 further comprising the step of covering exposed portions of the lead frame with a masking layer.

10. The method of claim 8 wherein the step of placing the sub-assembly includes placing the sub-assembly in an electroless nickel plating bath.

11. The method of claim 8 further comprising the step of coupling a solder bump to the barrier layer.

12. The method of claim 8 further comprising the step of agitating the electroless plating solution.

13. A process for forming a direct chip attach device comprising the steps of:
    providing the direct chip attach device including an encapsulated electronic chip having an opening to expose a first conductive portion coupled to the electronic chip;
    forming a barrier layer on the first conductive portion; and
    attaching a second conductive portion to the barrier layer.

14. The process of claim 13 wherein the step of providing the direct chip attach device includes providing an encapsulated power MOSFET device.

15. The process of claim 13 wherein the step of providing the direct chip attach device includes providing the encapsulated electronic chip, wherein the encapsulated electronic chip is attached to a lead frame including an exposed flag, the process further including the steps of:
    forming the barrier layer on the exposed flag; and
    attaching a third conductive portion to the barrier layer on the exposed flag.

16. The process of claim 13 wherein the step of forming the barrier layer includes forming a barrier layer including nickel.

17. The process of claim 13 wherein the step of forming the barrier layer comprises the steps of:
    placing the sub-assembly in an electroless plating bath; and
    injecting plating solution towards the opening to form the barrier layer on the conductive stud.

18. The process of claim 17 further comprising the step of agitating the electroless plating bath.

19. The process of claim 17 wherein the step of placing the sub-assembly includes placing the sub-assembly in an electroless nickel plating solution.

20. The process of claim 13 wherein the step of providing the direct chip attach device includes providing direct chip attach device wherein the first conductive portion comprises gold.

* * * * *